(12) United States Patent
Yang et al.

(10) Patent No.: US 9,252,730 B2
(45) Date of Patent: Feb. 2, 2016

(54) AUDIO PROCESSING DEVICE AND AUDIO SYSTEMS USING THE SAME

(75) Inventors: Chien-Chung Yang, Kaohsiung (TW); Chien-Sheng Chao, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 588 days.

(21) Appl. No.: 13/540,296

(22) Filed: Jul. 2, 2012

(65) Prior Publication Data
US 2013/0108075 A1    May 2, 2013

Related U.S. Application Data

(60) Provisional application No. 61/509,331, filed on Jul. 19, 2011, provisional application No. 61/525,447, filed on Aug. 19, 2011.

(51) Int. Cl.
*H04B 15/00* (2006.01)
*H03G 3/34* (2006.01)
*H03G 3/30* (2006.01)

(52) U.S. Cl.
CPC .............. *H03G 3/348* (2013.01); *H03G 3/3005* (2013.01); *H03G 3/3089* (2013.01)

(58) Field of Classification Search
CPC ........ H03G 3/348; H03G 3/345; H03F 1/305; H03F 2200/03; G11B 20/10527
USPC .................................................. 381/94.5, 92
See application file for complete search history.

(56) References Cited

U.S. PATENT DOCUMENTS

| | | | |
|---|---|---|---|
| 5,808,575 A | 9/1998 | Himeno et al. | |
| 6,532,443 B1 | 3/2003 | Nishiguchi et al. | |
| 7,242,783 B1 * | 7/2007 | Weeks et al. | 381/98 |
| 7,605,646 B2 * | 10/2009 | Trifonov et al. | 330/9 |
| 7,990,212 B1 * | 8/2011 | Tsang | 330/51 |
| 8,249,275 B1 * | 8/2012 | Tsang et al. | 381/94.5 |
| 2002/0003835 A1 | 1/2002 | Wu | |
| 2004/0184627 A1 | 9/2004 | Kost et al. | |
| 2006/0053187 A1 * | 3/2006 | Wagner | 708/300 |
| 2006/0199645 A1 * | 9/2006 | Canterbury et al. | 463/43 |
| 2008/0181419 A1 * | 7/2008 | Goldstein et al. | 381/57 |
| 2008/0267434 A1 * | 10/2008 | Schumaier | 381/314 |
| 2010/0277240 A1 * | 11/2010 | Qiu et al. | 330/278 |

FOREIGN PATENT DOCUMENTS

| | | | |
|---|---|---|---|
| CN | 1190773 | 8/1998 | |
| CN | 102074241 | 3/2012 | |
| WO | WO 2011/050975 | * 5/2011 | ............... H03G 3/30 |

OTHER PUBLICATIONS

English language machine translation of CN 1190773 (published Aug. 19, 1998).
English language machine translation of CN 102074241 (published Mar. 28, 2012).

* cited by examiner

*Primary Examiner* — Simon Sing
(74) *Attorney, Agent, or Firm* — McClure, Qualey & Rodack, LLP (57) ABSTRACT

An audio processing device is provided. The audio processing device includes a shaper. The shaper receives a digital input audio signal and generates an output audio signal at an output terminal according to the digital input audio signal. The shaper includes a gain adjustment unit and a shaping unit. The gain adjustment unit receives the digital input audio signal and adjusts the digital input audio signal to generate a gained audio signal. The shaping unit receives the gained audio signal. When the shaper operates in a first mode, the shaping unit shapes an envelope of the gained audio signal to generate a shaped audio signal, and the shaped audio signal serves as the output audio signal.

33 Claims, 7 Drawing Sheets

AUDIO PROCESSING DEVICE AND AUDIO SYSTEMS USING THE SAME

CROSS REFERENCE TO RELATED APPLICATIONS

This application claims the benefit of U.S. Provisional Application No. 61/509,331, filed on Jul. 19, 2011, the contents of which are incorporated herein by reference.

This application claims the benefit of U.S. Provisional Application No. 61/525,447, filed on Aug. 19, 2011, the contents of which are incorporated herein by reference.

BACKGROUND OF THE INVENTION

1. Field of the Invention

The invention relates to an audio system, and more particularly to an audio processing device applied for an audio system which can eliminate annoying pop and click sounds during volume adjustment of the audio system.

2. Description of the Related Art

Figure 1:
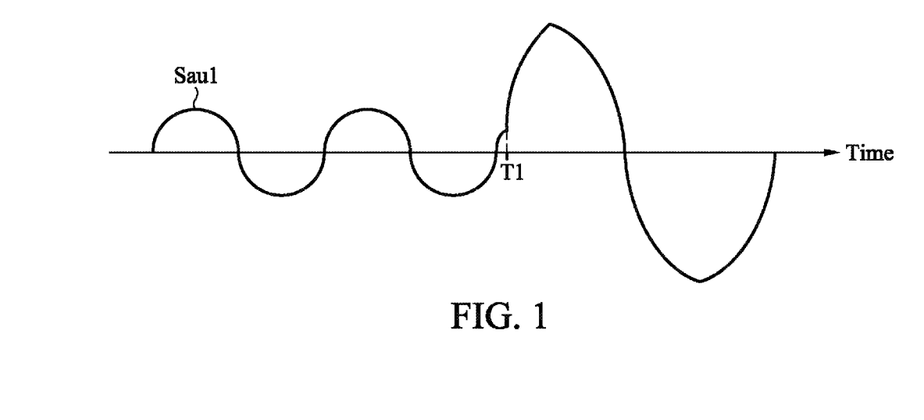
FIG. 1 is a schematic view showing variation of a digital audio signal during volume adjustment in an audio system.

In current digital audio systems, when the volume of the sounds played by the digital audio systems is being adjusted, unexpected pop and click sounds may occur. In this case, users may hear annoying sounds. FIG. 1 is a schematic view showing variation of a digital audio signal during volume adjustment in an audio system. In FIG. 1, the digital audio signal Sau1 is showed by a sine wave. Referring to FIG. 1, when the audio system adjusts the volume to be larger at a time point T1, the amplitude of the digital audio signal Sau1 is boosted immediately at the time point T1. The boosting at the time point T1 induces pop and click sounds played by a speaker of the audio system, which degrades the playing quality of the audio system.

Thus, it is desired to provide an audio processing device which can eliminate annoying pop and click sounds during volume adjustment.

BRIEF SUMMARY OF THE INVENTION

An exemplary embodiment of an audio processing device comprises a shaper. The shaper receives a digital input audio signal and generates an output audio signal at an output terminal according to the digital input audio signal. The shaper comprises a gain adjustment unit and a shaping unit. The gain adjustment unit receives the digital input audio signal and adjusts the digital input audio signal to generate a gained audio signal. The shaping unit receives the gained audio signal. When the shaper operates in a first mode, the shaping unit shapes an envelope of the gained audio signal to generate a shaped audio signal, and the shaped audio signal serves as the output audio signal.

An exemplary embodiment of an audio system comprises a shaper, a digital-to-analog conversion unit, and a playing unit. The shaper receives a digital input audio signal and generates an output audio signal at an output terminal according to the digital input audio signal. The digital-to-analog conversion unit receives the output audio signal and converts the output audio signal to an analog audio signal. The playing unit receives the analog audio signal and plays sounds according to the analog audio signal. The shaper comprises a gain adjustment unit and a shaping unit. The gain adjustment unit receives the digital input audio signal and adjusts the digital input audio signal to generate a gained audio signal. The shaping unit receives the gained audio signal. When the shaper operates in a first mode, the shaping unit shapes an envelope of the gained audio signal to generate a shaped audio signal, and the shaped audio signal serves as the output audio signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Audio systems are provided. In an exemplary embodiment of an audio system in FIG. 2, an audio system 2 comprises an input processing unit 20, a shaper 21, an output processing unit 22, a digital-to-analog converter (DAC) 23, and a playing unit 24. An audio processing device 200 is composed of the input processing unit 20, the shaper 21, and the output processing unit 22. The input processing unit 20 receives digital audio data Din and processes the digital audio data Din to generate a digital input audio signal AUin. In the embodiment, the input processing unit 20 is implemented by a sigma-delta modulator. The sigma-delta modulator 20 modules the digital audio data Din to generate the digital input audio signal AUin. The shaper 21 receives the digital input audio signal AUin and generates an output audio signal AUout according to the digital input audio signal AUin at an output terminal Tout of the shaper 21.

Figure 2:
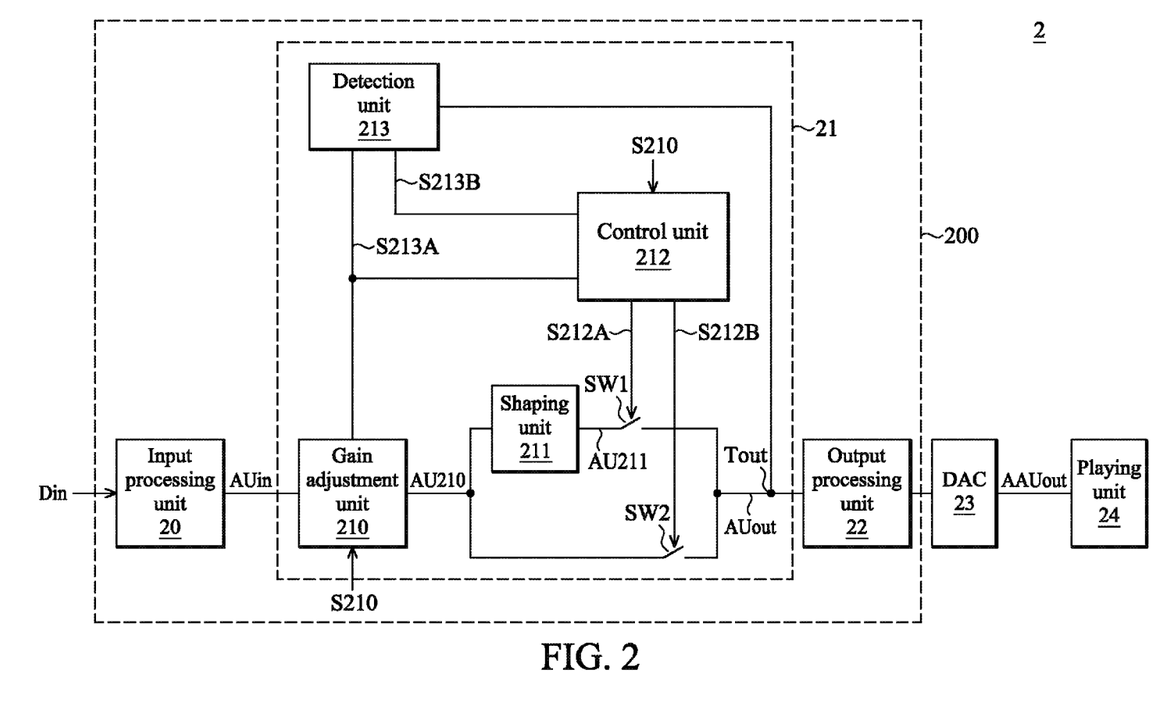
FIG. 2 shows an exemplary embodiment of an audio system.

Referring to FIG. 2, the shaper 21 comprises a gain adjustment unit 210, a shaping unit 211, a control unit 212, a detection unit 213, and switches SW1 and SW2. The gain adjustment unit 210 receives the digital input audio signal AUin and adjusts the digital input audio signal AUin by a gain parameter to generate a gained audio signal AU210. The timing of adjusting the digital input audio signal AUin is controlled by a control signal S213A from the detection unit 213. The generation of the control signal S213A will be described later. In the embodiment, the gain parameter is variable with a value of an adjustment signal S210 received by the gain adjustment unit 210. In a normal mode of the shaper 21, the value of the adjustment signal S210 is constant and the gain parameter is also constant, and the amplitude of the gained audio signal AU210 is not varied. When the gain parameter becomes larger or smaller with the variation of the value of the adjustment signal S210, the shaper 21 enters an adjustment mode from the normal mode. In other words, the gain parameter in the adjustment mode is larger or smaller the gain parameter existing before the shaper 21 operates in the adjustment mode. In the adjustment mode, during the gain adjustment unit 210 adjusts the digital input audio signal AUin, the amplitude of the gained audio signal AU210 is increased or decreased.

The shaping unit 211 receives the gained audio signal AU210 and shapes an envelope of the gained audio signal AU210 to generate a shaped audio signal AU211. The shaping unit 211 may be implemented by a filter. In the embodiment, the shaping unit 211 is implemented by a raise-cosine filter. However, the raise-cosine filter is given as an example without limitation, and the shaping unit 211 may be implemented by other types of filters.

The switch SW1 is coupled between the shaping unit 211 and the output terminal Tout and controlled by a switch signal S212A. The switch SW2 is coupled between the gain adjustment unit 210 and the output terminal Tout and controlled by a switch signal S212B.

The detection unit 213 is coupled to the output terminal Tout for receiving the output audio signal AUout. The detection unit 213 detects a plurality of zero-crossing points of the output audio signal AUout and generates the control signal S213A according to the detection result. In other words, the control signal S213A may indicate the occurrence of the zero-crossing points of the output audio signal AUout. Both of the gain adjustment unit 210 and the control unit 212 receive the control signal S213A.

The control unit 212 receives not only the control signal S213A from the detection unit 213 but also the adjustment signal S210. The control unit 212 generates the switch signals S212A and S212B according to the control signal S213A and the adjustment signal S210.

In the following, the operation of the shaper 21 will be described.

Figure 3:
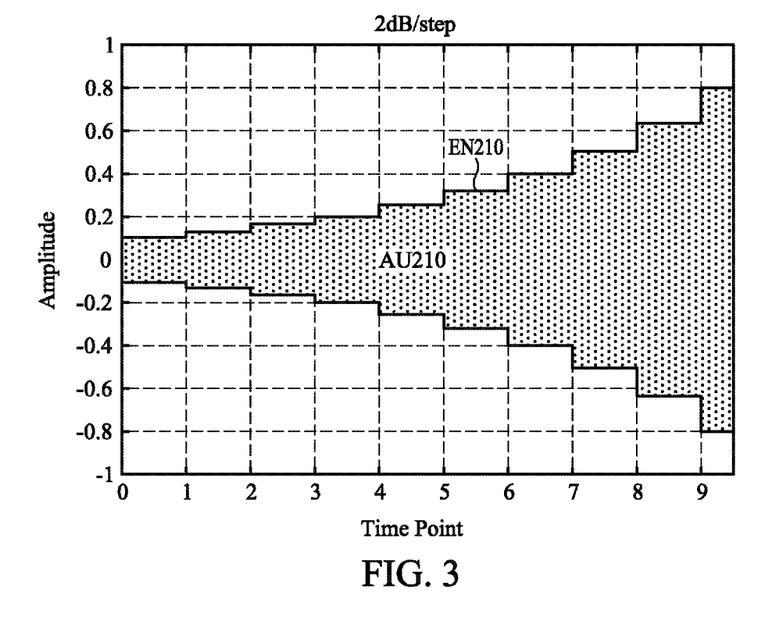
FIG. 3 shows a gained audio signal in the audio system in FIG. 2.
Figure 4:
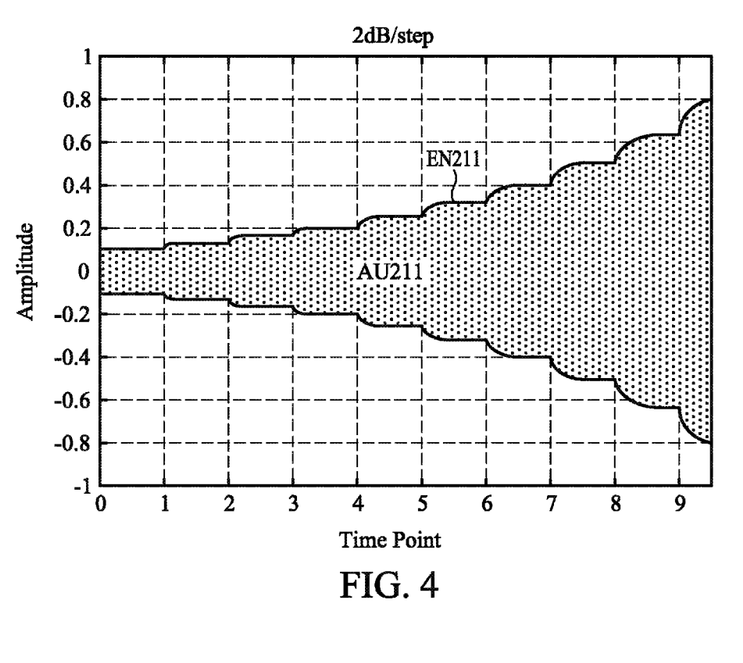
FIG. 4 shows a shaped audio signal in the audio system in FIG. 2.

As the above description, when the gain parameter becomes larger or smaller with the variation of the value of the adjustment signal S210, the shaper 21 enters the adjustment mode from the normal mode. In the adjustment mode, the output audio signal AUout has a plurality of zero-crossing points which are detected by the detection unit 213. According to the control signal S213A related to the detection of the zero-crossing points, the gain adjustment unit 210 adjusts the digital input audio signal AUin at a time point when at least one zero-crossing point occurs in the adjustment mode to generate the gained audio signal AU210. In the embodiment, for example, the gain adjustment unit 210 adjusts the digital input audio signal AUin to increase the amplitude of the digital input audio signal AUin at nine time points when nine zero-crossing points among the plurality of zero-crossing points occur in the adjustment mode, that is the number of adjusting the digital input audio signal AUin by the gain adjustment unit 210 is equal to nine. As shown in FIG. 3, the amplitude of the gained audio signal AU210 derived from the digital input audio signal AUin is increased at nine time points when nine zero-crossing points occur. Then, the shaping unit 211 shapes the envelope of the gained audio signal AU210 to generate the shaped audio signal AU211. As shown in FIGS. 3 and 4, after the envelop shaping, the envelop EN211 of the shaped audio signal AU211 is smoother than the envelope EN210 of the gained audio signal AU210.

Figure 5:
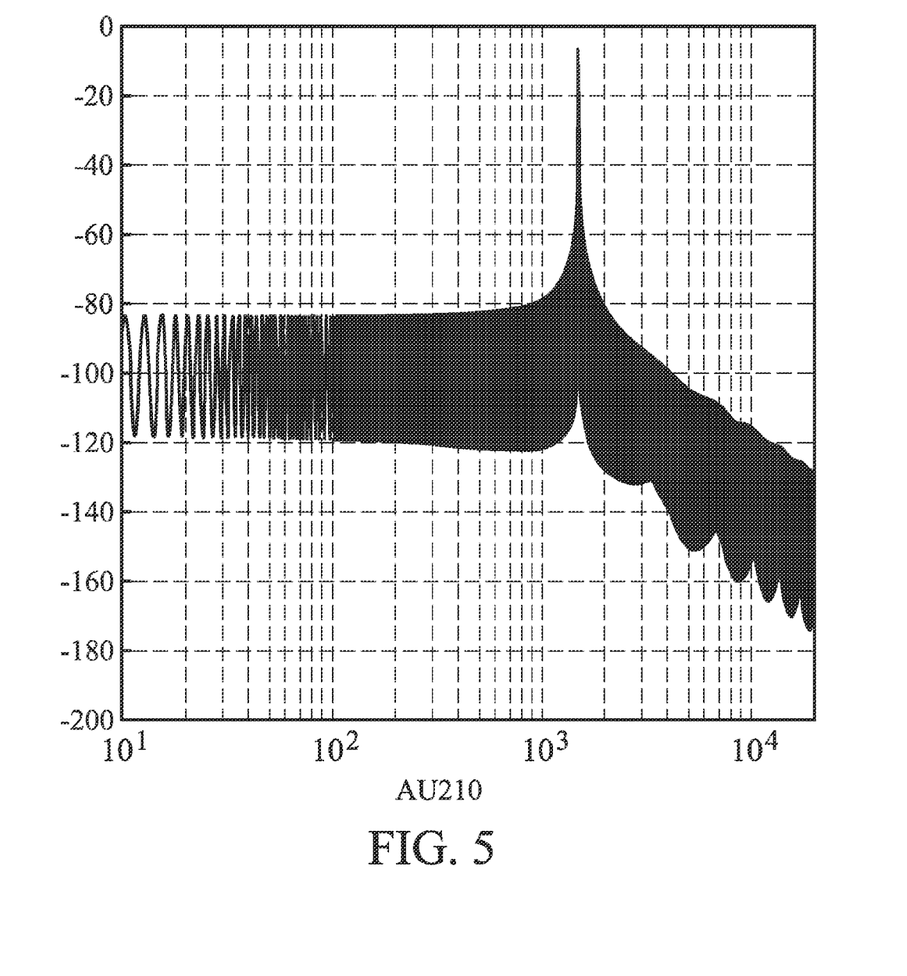
FIG. 5 shows a spectrum of a gained audio signal in FIG. 2.
Figure 6:
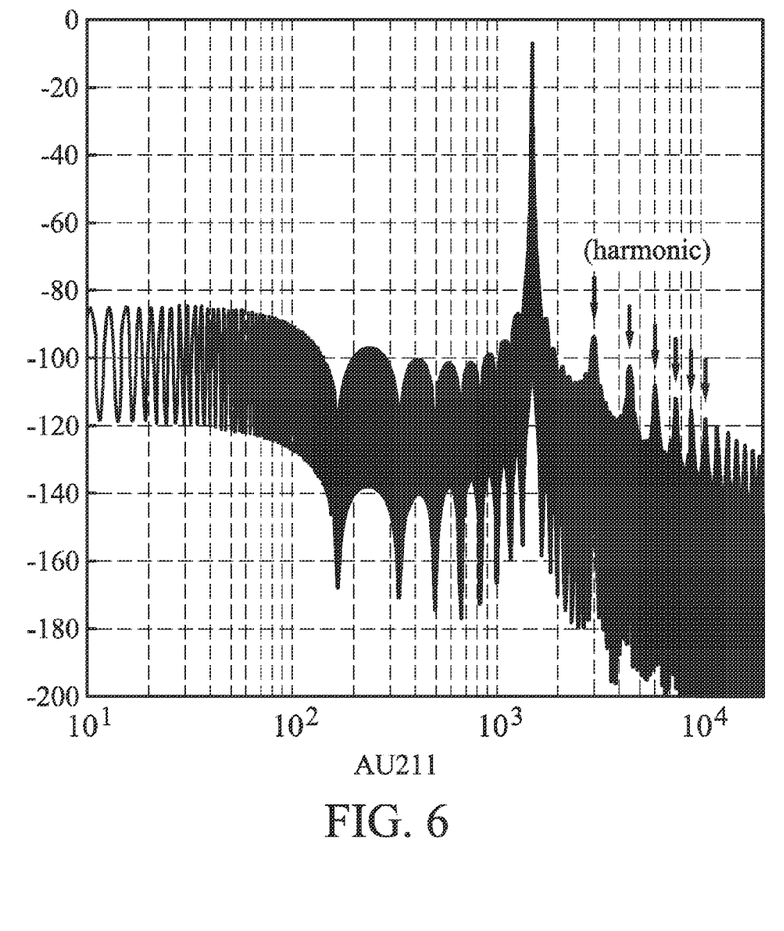
FIG. 6 shows a spectrum of a shaped audio signal in FIG. 2.

FIG. 5 shows a spectrum of the gained audio signal AU210. FIG. 6 shows a spectrum of the shaped audio signal AU211 processed by the envelope shaping. Comparing the gained audio signal AU210 with the gained audio signal AU211, between 20 Hz to 20 kHz, except for the main frequency component, the other frequency components of the shaped audio signal AU211 in FIG. 6 have smaller power than that of the gained audio signal AU210 in FIG. 5.

The control unit 212 also receives the adjustment signal S210. When the gain parameter becomes larger or smaller with the variation of the value of the adjustment signal S210, the control unit 212 is aware that the shaper 21 has entered the adjustment mode from the normal mode. In the adjustment mode, the control unit 212 generates the switch signal S212A and the switch signal S212B according to the control signal S213A respectively to turn on the switch SW1 and turn off the switch SW2 at the above time points when the nine zero-crossing points occur. At this time, the shaped audio signal AU211 with the smoother envelop EN211 is transmitted through the turned-on switch SW1 to serve as the output audio signal AUout.

According to the embodiment of FIGS. 2-4, in the adjustment mode, the control unit 212 turns on the switch SW1 and turns off the switch SW2 by nine times, in other words, the number of changing the states of the switches SW1 and SW2 by the control unit 212 is equal to the number of adjusting the digital input audio signal AUin by the gain adjustment unit 210. In detailed, the control unit 212 turns on the switch SW1 and turns off the switch SW2 at the above nine time points when the nines zero-crossing points occur respectively through the switch signals S212A and S212B. In other embodiments, in the adjustment mode, the control unit 212 turns on the switch SW1 and turns off the switch SW2 once. In detailed, when the shaper 21 enters the adjustment mode from the normal mode according to the variation of the value of the adjustment signal S210, the control unit 212 turns on the switch SW1 and turns off the switch SW2 at a time point when one zero-crossing point of the output audio signal AUout occurs respectively through to the switch signals S212A and S212B. Then, the turned-on state of the switch SW1 and the turned-off state of the switch SW2 are maintained until the shaper 21 leaves the adjustment mode.

The switching from the adjustment mode to the normal mode will be described in the following. In the embodiment of FIGS. 2-4, after the control unit 212 turns on the switch SW1 (or turns off the switch SW2) at the nine time points when the nine zero-crossing points occur, the control unit 212 turns off the switch SW1 and turns on the switch SW2 at a time point when one zero-crossing point of the output audio signal AUout occurs respectively through to the switch signals S212A and S212B, for example, the time point when the first zero-crossing point occurs after the above nine zero-crossing points. In another embodiment, after the control unit 212 turns on the switch SW1 (or turns off the switch SW2) for a predetermined time, the control unit 212 turns off the switch SW1 and turns on the switch SW2 at a time point when one zero-crossing point of the output audio signal AUout occurs respectively through the switch signal S212A and the switch signal S212B, for example, the time point when the first zero-crossing point occurs after the predetermined period. The predetermined period is determined according to the type of the filter implemented for the shaping unit 211. Then, the shaper 21 switches to operate in the normal mode. In the normal mode, the gained audio signal AU210 is transmitted through the turned-on switch SW2 to serve as the output audio signal AUout.

In further another embodiment, the detection unit 213 further determines whether the output audio signal AUout is at a stable state and generates a control signal S213B according to the determination result. In the adjustment mode, when the detection unit 213 determines that the output audio signal AUout is at the stable state, the shaper 21 switches to operate in the normal mode. For example, in the case where the control unit 212 turns on the switch SW1 and turns off the switch SW2 at the nine time points when the nine zero-crossing points occur, the output audio signal AUout may be at the stable state after the nine time points; in the case where the control unit 212 turns on the switch SW1 and turns off the switch SW2 at one time point, the output signal AUout may be at the stable state after the one time point. In the embodiment, the control unit 212 further receives the control signal S213B, and, thus, the control unit 212 generates the switch signals S212A and S212B according to the control signal S213A related to the detection of the zero-crossing points and the control signal S213B related to the determination of the stable state. The control unit 212 may be aware of whether the shaper 21 will operate in the normal mode according to the control signal S213B. When the control unit 212 is aware that the shaper 21 will operates in the normal mode according to the control signal S213B, the control unit 212 generates the switch signal S212A and the switch signal S212B respectively to turn off the switch SW1 and turn on the switch SW2 at a time point when one zero-crossing point of the output audio signal AUout occurs. Then, the shaper 21 switches to operate in the normal mode. In the normal mode, the gained audio signal AU210 is transmitted through the turned-on switch SW2 to serve as the output audio signal AUout. In the embodiment, the stable state occurs when the amplitude of the output audio signal AUout is at a level which is determined by the gain parameter.

Referring to FIG. 2, the output processing unit 22 receives the output audio signal AUout and processes the output audio signal AUout. In the embodiment, the output processing unit 22 processes the output audio signal AUout to perform sound effect adjustment. The processed output audio signal AUout is transmitted to the DAC 23. The DAC 23 converts the processed output audio signal AUout to an analog audio signal AAUout. The playing unit 24 receives the analog audio signal AAUout and plays sounds according to the analog audio signal AAUout. In another embodiment, the output processing unit 22 may be omitted. That is, the output audio signal AUout is directly transmitted to the DAC 23 for digital-to-analog conversion.

According to the above embodiments, when the gain adjustment unit 210 adjusts the digital input audio signal AUin to vary the amplitude of the digital input audio signal AUin in the adjustment mode, the volume of the sounds played by the playing unit 24 becomes larger or smaller. When the sound volume is being adjusted, since the envelope of the shaped audio signal AU211 is smoother, annoying pop and click sounds may not occur or not easily be sensed by human ears.

Referring to FIG. 5, in the adjustment mode, if there is no envelope shaping, the audio band power excluding main frequency component results in annoying pop and click sounds. For the above description, in the adjustment mode, between 20 Hz to 20 kHz, except for the main frequency component, the other frequency components of the shaped audio signal AU211 in FIG. 6 have less power than that of the gained audio signal AU210 in FIG. 5. Thus, after envelope shaping, the sounds generated according to the other frequency components of the gained audio signal AU211 may not easily be sensed by human ears.

Figure 7:
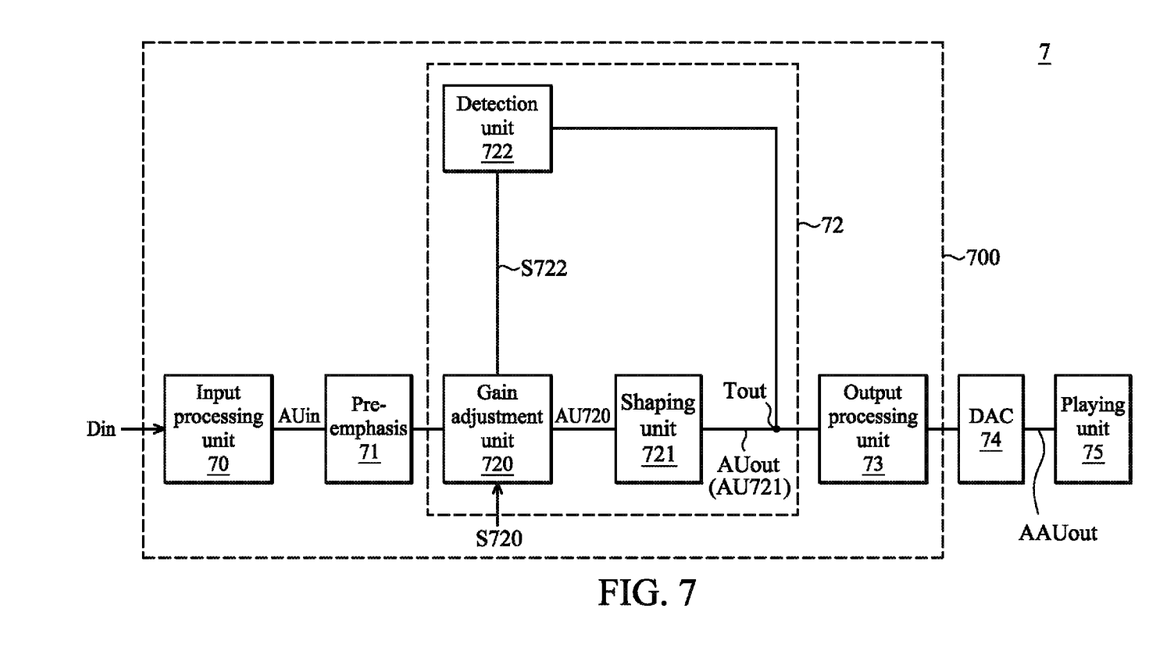
FIG. 7 shows another exemplary embodiment of an audio system.

FIG. 7 shows an exemplary embodiment of an audio system. As shown in FIG. 7, an audio system 7 comprises an input processing unit 70, a pre-emphasis unit 71, a shaper 72, an output processing unit 73, a digital-to-analog converter (DAC) 74, and a playing unit 75. An audio processing device 700 is composed of the input processing unit 70, the pre-emphasis unit 71, the shaper 72, and the output processing unit 73. The input processing unit 70 receives digital audio data Din and processes the digital audio data Din to generate a digital input audio signal AUin. In the embodiment, the input processing unit 70 is implemented by a sigma-delta modulator. The sigma-delta modulator 70 modules the digital audio data Din to generate the digital input audio signal AUin. The pre-emphasis unit 71 receives the digital input audio signal AUin from the input processing unit 70 and enhances power of frequency components in an audio frequency band (20 Hz-20 kHz) of the digital input audio signal AUin. The shaper 72 receives the digital input audio signal AUin enhanced by the pre-emphasis unit 71 and generates an output audio signal AUout according to the enhanced digital input audio signal AUin at an output terminal Tout of the shaper 72. In the embodiment, the shaper 72 is always in an adjustment mode. In other words, the shaper 72 operates in a single mode.

Referring to FIG. 7, the shaper 72 comprises a gain adjustment unit 720, a shaping unit 721, and a detection unit 722. The gain adjustment unit 720 receives the digital input audio signal AUin and adjusts the digital input audio signal AUin by a gain parameter to generate a gained audio signal AU720. The timing of adjusting the digital input audio signal AUin is controlled by a control signal S722 from the detection unit 722. The generation of the control signal S722 will be described later. In the embodiment, the gain parameter is variable with a value of an adjustment signal S720 received by the gain adjustment unit 720. When the value of the adjustment signal S720 is constant, the gain parameter is also constant. In this case, the amplitude of the gained audio signal AU720 is not varied. When the gain parameter becomes larger or smaller with the variation of the value of the adjustment signal S720, the amplitude of the gained audio signal AU720 is increased or decreased.

The shaping unit 721 receives the gained audio signal AU720 and shapes an envelope of the gained audio signal AU720. The shaping unit 721 may be implemented by a filter. In the embodiment, the shaping unit 721 is implemented by a raise-cosine filter. However, the raise-cosine filter is given as an example without limitation, and the shaping unit 721 may be implemented by other types of filters.

The detection unit 722 is coupled to the output terminal Tout for receiving the output audio signal AUout. The detection unit 722 detects a plurality of zero-crossing points of the output audio signal AUout and generates the control signal S722 according to the detection result. In other words, the control signal S722 may indicate the occurrence of the zero-crossing points of the output audio signal AUout. The control signal S722 is transmitted to the gain adjustment unit 720. Thus, according to the control signal S722, the gain adjustment unit 720 adjusts the digital input audio signal AUin at a time point when at least one zero-crossing point occurs to generate the gained audio signal AU720. Then, the shaping unit 721 shapes the envelope of the gained audio signal AU720 to generate a shaped audio signal AU721. In the embodiment, the shaped audio signal AU721 directly serves as the output audio signal AUout.

Referring to FIG. 7, the output processing unit 73 receives the output audio signal AUout and processes the output audio signal AUout. In the embodiment, the output processing unit 73 processes the output audio signal AUout to perform sound effect adjustment. The processed output audio signal AUout is transmitted to the DAC 74. The DAC 74 converts the processed output audio signal AUout to an analog audio signal AAUout. The playing unit 75 receives the analog audio signal AAUout and plays sounds according to the analog audio signal AAUout. In another embodiment, the output processing unit 73 may be omitted. That is, the output audio signal AUout is directly transmitted to the DAC 74 for digital-to-analog conversion.

In the embodiment, when the shaping unit 721 which is implemented by a filter (for example a raise-cosine filter) shapes the envelope of the gained audio signal AU720 by a transfer function, the pre-emphasis unit 71 enhances the power of the frequency components in the audio frequency band of the digital input audio signal AUin with another transfer function inverse to the transfer function of the envelope shaping.

According to the above embodiments, when the gain adjustment unit 720 adjusts the digital input audio signal AUin to vary the amplitude of the digital input audio signal AUin, the volume of the sounds played by the playing unit 75 becomes larger or smaller. When the sound volume is adjusted, since the envelope of the output audio signal AUout is smoother, annoying pop and click sounds may not occur or not easily be sensed by human ears. Moreover, due to the operation of the pre-emphasis unit 71, the power of the frequency components in the audio frequency band of the digital input audio signal AUin is enhanced. Thus, after envelope shaping, the original frequency components in the audio frequency band of the digital input audio signal AUin may not weaken, preventing the played sounds from distortion.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An audio processing device comprising:
a shaper for receiving a digital input audio signal and generating an output audio signal at an output terminal according to the digital input audio signal,
wherein the shaper comprises:
a gain adjustment unit for receiving the digital input audio signal and adjusting the digital input audio signal to generate a gained audio signal;
a shaping unit for receiving the gained audio signal;
a detection unit, coupled to the output terminal, for receiving the output audio signal and detecting a plurality of zero-crossing points of the output audio signal to generate a first control signal;
a control unit for receiving the first control signal and generating a first switch signal and a second switch signal according to the first control signal in the first mode;
a first switch coupled between the shaping unit and the output terminal and controlled by the first switch signal; and
a second switch coupled between the gain adjustment unit and the output terminal and controlled by the second switch signal,
wherein in a first mode, the gain adjustment unit receives the control signal and adjusts the digital input audio signal at at least one time point when at least one of the plurality of the zero-crossing points occurs according to the control signal;
wherein in the first mode, the control unit generates the first switch signal and the second switch signal according to the first control signal respectively to turn on the first switch and turn off the second switch at the at least one time point when the at least one of the plurality of the zero-crossing points; and
wherein when the shaper operates in the first mode, the shaping unit shapes an envelope of the gained audio signal to generate a shaped audio signal, and the shaped audio signal serves as the output audio signal.

2. The audio processing device as claimed in claim 1, wherein after the first switch is turned on at the at least one time point when the at least one of the plurality of the zero-crossing points occurs in the first mode, the control unit generates the first switch signal and the second switch signal respectively to turn off the first switch and turn on the second switch at a time point when one of the plurality of the zero-crossing points occurs, and then the shaper switches to operate in a second mode.

3. The audio processing device as claimed in claim 1, wherein after the first switch is turned on at the at least one time point when the at least one of the plurality of the zero-crossing points occurs for a predetermined period in the first mode, the control unit generates the first switch signal and the second switch signal respectively to turn off the first switch and turn on the second switch at a time point when one of the plurality of the zero-crossing points occurs, and then the shaper switches to operate in a second mode.

4. The audio processing device as claimed in claim 3 wherein the shaping unit is implemented by a filter, and the predetermined period is determined according to a type of the filter.

5. The audio processing device as claimed in claim 4, wherein the shaping unit is implemented by a raise-cosine filter.

6. The audio processing device as claimed in claim 3 wherein in the first mode, the control unit turns on the first switch turns off the second switch once.

7. The audio processing device as claimed in claim 1,
wherein in the first mode, the detection unit further determines whether the output audio signal is at a stable state and generates a second control signal according to the determination result, and
wherein when the detection unit determines that the output audio signal is at a stable state, the control unit generates the first switch signal and the second switch signal respectively to turn off the first switch and turn on the second switch at a time point when one of the plurality of the zero-crossing points occurs, and the shaper switches to operate in a second mode.

8. The audio processing device as claimed in claim 7, wherein the gain adjustment unit adjusts the digital input audio signal by a gain parameter, and the gain parameter existing when the shaper operates in the first mode is larger or smaller than the gain parameter existing before the shaper operates in the first mode.

9. The audio processing device as claimed in claim 1 further comprising:
a pre-emphasis unit for enhancing power of frequency components in an audio band of the digital input audio signal in the first mode.

10. The audio processing device as claimed in claim 9, wherein when the shaping unit shapes the envelope of the digital input audio signal with a first transfer function, the pre-emphasis unit enhances the power of the frequency components in an audio frequency band of the digital input audio signal with a second transfer function inverse to the first transfer function.

11. The audio processing device as claimed in claim 10, wherein the shaping unit is implemented by a raise-cosine filter.

12. The audio processing device as claimed in claim 1, wherein in the first mode, an envelope of the shaped audio signal is smoother than the envelope of the gained audio signal.

13. The audio processing device as claimed in claim 1, wherein the gain adjustment unit adjusts the digital input audio signal by a gain parameter, and the gain parameter is variable.

14. The audio processing device as claimed in claim 1, wherein the shaping unit is implemented by a raise-cosine filter.

15. The audio processing device as claimed in claim 1 further comprising:
a processing unit for receiving digital audio data and processing the digital audio data to generate the digital input audio signal.

16. The audio processing device as claimed in claim 15, wherein the processing unit is implemented by a sigma-delta modulator.

17. The audio processing device as claimed in claim 1 further comprising:
a processing unit for receiving the output audio signal and processing the output audio signal for sound playing.

18. The audio processing device as claimed in claim 1, wherein when the shaper operates in a second mode, the gained audio signal is transmitted to the output terminal to serve as the output audio signal.

19. The audio processing device as claimed in claim 18, wherein amplitude of the gained audio signal is varied in the first mode, and the amplitude of the gained audio signal is not varied in the second mode.

20. An audio system comprising:
a shaper for receiving a digital input audio signal and generating an output audio signal at an output terminal according to the digital input audio signal;
a digital-to-analog conversion unit for receiving the output audio signal and converting the output audio signal to an analog audio signal; and
a playing unit for receiving the analog audio signal and playing sounds according to the analog audio signal,
wherein the shaper comprises:
a gain adjustment unit for receiving the digital input audio signal and adjusting the digital input audio signal to generate a gained audio signal;
a shaping unit for receiving the gained audio signal;
a detection unit, coupled to the output terminal, for receiving the output audio signal and detecting a plurality of zero-crossing points of the output audio signal to generate a first control signal;
a control unit for receiving the first control signal and generating a first switch signal and a second switch signal according to the first control signal in the first mode;
a first switch coupled between the shaping unit and the output terminal and controlled by the first switch signal; and
a second switch coupled between the gain adjustment unit and the output terminal and controlled by the second switch signal,
wherein in a first mode, the gain adjustment unit receives the first control signal and adjusts the digital input audio signal at at least one time point when at least one of the plurality of the zero-crossing points occurs according to the first control signal,
wherein in the first mode, the control unit generates the first switch signal and the second switch signal according to the first control signal respectively to turn on the first switch and turn off the second switch at the at least one time point when the at least one of the plurality of the zero-crossing points, and
wherein when the shaper operates in the first mode, the shaping unit shapes an envelope of the gained audio signal to generate a shaped audio signal, and the shaped audio signal serves as the output audio signal.

21. The audio system as claimed in claim 20, wherein after the first switch is turned on at the at least one time point when the at least one of the plurality of the zero-crossing points occurs in the first mode, the control unit generates the first switch signal and the second switch signal respectively to turn off the first switch and turn on the second switch at a time point when one of the plurality of the zero-crossing points occurs, and then the shaper switches to operate in a second mode.

22. The audio system as claimed in claim 20, wherein after the first switch is turned on at the at least one time point when the at least one of the plurality of the zero-crossing points occurs for a predetermined period in the first mode, the control unit generates the first switch signal and the second switch signal respectively to turn off the first switch and turn on the second switch at a time point when one of the plurality of the zero-crossing points occurs, and then the shaper switches to operate in a second mode.

23. The audio system as claimed in claim 22 wherein the shaping unit is implemented by a filter, and the predetermined period is determined according to a type of the filter.

24. The audio system as claimed in claim 23, wherein the shaping unit is implemented by a raise-cosine filter.

25. The audio system as claimed in claim 20,
wherein in the first mode, the detection unit further determines whether the output audio signal is at a stable state and generates a second control signal according to the determination result, and
wherein when the detection unit determines that the output audio signal is at a stable state, the control unit generates the first switch signal and the second switch signal respectively to turn off the first switch and turn on the second switch at a time point when one of the plurality of the zero-crossing points occurs, and the shaper switches to operate in a second mode.

26. The audio system as claimed in claim 25, wherein the gain adjustment unit adjusts the digital input audio signal by a gain parameter, and the gain parameter existing when the shaper operates in the first mode, is larger or smaller than the gain parameter existing before the shaper operates in the first mode.

27. The audio system as claimed in claim 20 further comprising:
a pre-emphasis unit for enhancing power of frequency components in an audio band of the digital input audio signal in the first mode.

28. The audio system as claimed in claim 27, wherein when the shaping unit shapes the envelope of the digital input audio signal with a first transfer function, the pre-emphasis unit enhances the power of the frequency components in an audio frequency band of the digital input audio signal with a second transfer function inverse to the first transfer function.

29. The audio system as claimed in claim 28, wherein the shaping unit is implemented by a raise-cosine filter.

30. The audio system as claimed in claim 20, wherein in the first mode, an envelope of the shaped audio signal is smoother than the envelope of the gained audio signal.

31. The audio system as claimed in claim 20 further comprising:
   a processing unit for receiving digital audio data and processing the digital audio data to generate the digital input audio signal.

32. The audio system as claimed in claim 31, wherein the processing unit is implemented by a sigma-delta modulator.

33. The audio system as claimed in claim 20 further comprising:
   a processing unit for receiving the output audio signal and processing the output audio signal for sound playing.

\* \* \* \* \*